(12) United States Patent
Zhang et al.

(10) Patent No.: US 10,079,250 B2
(45) Date of Patent: Sep. 18, 2018

(54) ARRAY SUBSTRATE, ITS MANUFACTURING METHOD, AND DISPLAY DEVICE

(71) Applicant: BOE TECHNOLOGY GROUP CO., LTD., Beijing (CN)

(72) Inventors: Fangzhen Zhang, Beijing (CN); SeungJin Choi, Beijing (CN); Jing Niu, Beijing (CN); Shuang Sun, Beijing (CN); Zhijun Lv, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 15/310,182

(22) PCT Filed: Dec. 22, 2015

(86) PCT No.: PCT/CN2015/098203
§ 371 (c)(1),
(2) Date: Nov. 10, 2016

(87) PCT Pub. No.: WO2017/016152
PCT Pub. Date: Feb. 2, 2017

(65) Prior Publication Data
US 2017/0271374 A1    Sep. 21, 2017

(30) Foreign Application Priority Data
Jul. 28, 2015    (CN) .......................... 2015 1 0451468

(51) Int. Cl.
*H01L 21/00*    (2006.01)
*H01L 21/16*    (2006.01)
(Continued)

(52) U.S. Cl.
CPC ...... *H01L 27/1225* (2013.01); *H01L 21/0274* (2013.01); *H01L 21/02565* (2013.01);
(Continued)

(58) Field of Classification Search
CPC ........... H01L 21/02565; H01L 21/0274; H01L 21/441; H01L 27/1218; H01L 27/1225;
(Continued)

(56) References Cited

U.S. PATENT DOCUMENTS 8,431,452 B2    4/2013   Hou et al.
2010/0012946 A1  1/2010  Hou et al.
(Continued)

FOREIGN PATENT DOCUMENTS

CN    101630098 B    12/2010
CN    102654698 A    9/2012
(Continued)

OTHER PUBLICATIONS

International Search Report and Written Opinion for Application No. PCT/CN2015/098203, dated May 4, 2016, 13 Pages.
(Continued)

*Primary Examiner* — Duy T Nguyen
(74) *Attorney, Agent, or Firm* — Brooks Kushman P.C.

(57) ABSTRACT

The present disclosure provides an array substrate, its manufacturing method, and a display device. The method includes steps of forming a passivation layer on a base substrate, and forming a contact layer and a pixel electrode on the base substrate with the passivation layer through a single patterning process. The contact layer is made of an identical transparent conductive material to the pixel electrode.

18 Claims, 8 Drawing Sheets

(51) Int. Cl.
*H01L 27/12* (2006.01)
*H01L 29/24* (2006.01)
*H01L 29/786* (2006.01)
*H01L 21/027* (2006.01)
*H01L 21/441* (2006.01)
*H01L 29/45* (2006.01)
*H01L 29/66* (2006.01)
*H01L 21/02* (2006.01)

(52) U.S. Cl.
CPC .......... *H01L 21/441* (2013.01); *H01L 27/127* (2013.01); *H01L 27/1218* (2013.01); *H01L 27/1288* (2013.01); *H01L 29/24* (2013.01); *H01L 29/45* (2013.01); *H01L 29/66969* (2013.01); *H01L 29/7869* (2013.01)

(58) Field of Classification Search
CPC ... H01L 27/127; H01L 27/1288; H01L 29/24; H01L 29/45; H01L 29/66969; H01L 29/7869
USPC .......................................................... 438/104
See application file for complete search history.

(56) References Cited

U.S. PATENT DOCUMENTS

| | | | | |
|---|---|---|---|---|
| 2012/0001182 | A1* | 1/2012 | Choi | H01L 29/4908 257/59 |
| 2015/0162351 | A1* | 6/2015 | Hiwatashi | H01L 27/124 257/43 |
| 2015/0303225 | A1 | 10/2015 | Jiang et al. | |
| 2016/0020227 | A1* | 1/2016 | Choi | G02F 1/1362 257/43 |

FOREIGN PATENT DOCUMENTS

| | | |
|---|---|---|
| CN | 101770121 B | 11/2012 |
| CN | 103018977 A | 4/2013 |
| CN | 102693938 B | 6/2014 |
| CN | 104576523 A | 4/2015 |
| CN | 105140234 A | 12/2015 |
| KR | 20100019019 A | 2/2010 |

OTHER PUBLICATIONS

First Office Action for Chinese Application No. 201510451468.7, dated Aug. 2, 2017, 6 Pages.

* cited by examiner

US 10,079,250 B2

ARRAY SUBSTRATE, ITS MANUFACTURING METHOD, AND DISPLAY DEVICE

CROSS-REFERENCE TO RELATED APPLICATIONS

This application is the U.S. national phase of PCT Application No. PCT/CN2015/098203 filed on Dec. 22, 2015, which claims priority to Chinese Patent Application No. 201510451468.7 filed on Jul. 28, 2015, the disclosures of which are incorporated in their entirety by reference herein.

TECHNICAL FIELD

The present disclosure relates to the field of semiconductor, in particular to an array substrate, its manufacturing method and a display device.

BACKGROUND

A display device includes an array substrate, which includes a base substrate and a thin film transistors (TFT) structure arranged on the base substrate. An electric signal may be applied to the TFT structure on the array substrate, so as to display an image.

During the manufacture of the array substrate, it is required to form a material layer with a strong adhesive force relative to $SiO_2$ and copper and a metal layer on a passivation layer and the base substrate sequentially, so as to form contact layers between gate metal patterns, and between an electrode metal pattern and the base substrate. Hence, the manufacture of the array substrate is relatively complex.

SUMMARY

An object of the present disclosure is to provide an array substrate, its manufacturing method and a display device, so as to simplify the manufacture of the array substrate.

In one aspect, the present disclosure provides in some embodiments a method for manufacturing an array substrate, including steps of: forming a passivation layer on a base substrate; and forming a contact layer and a pixel electrode on the base substrate with the passivation layer through a single patterning process, the contact layer being made of an identical transparent conductive material to the pixel electrode.

Optionally, prior to the step of forming the passivation layer on the base substrate, the method further includes forming an active layer, a common electrode and a source/drain metal pattern on the base substrate through a single patterning process. The step of forming the passivation layer on the base substrate includes forming the passivation layer on the base substrate with the active layer, the common electrode and the source/drain metal pattern.

Optionally, the step of forming the active layer, the common electrode and the source/drain metal pattern on the base substrate through a single patterning process includes: forming an indium gallium zinc oxide (IGZO) layer on the base substrate; treating the IGZO layer to form a conductive IGZO layer; forming a metal layer on the base substrate with the conductive IGZO layer; treating the IGZO layer and the metal layer through a single patterning process to form the source/drain metal pattern, an initial active layer made of the conductive IGZO layer, and the common electrode made of the conductive IGZO layer; and treating the initial active layer made of the conductive IGZO Layer to form an active layer made of a semiconductive IGZO layer.

Optionally, the step of forming the contact layer and the pixel electrode on the base substrate with the passivation layer through a single patterning process includes: forming a transparent conductive material layer, a metal layer and an anti-oxidation material layer sequentially on the base substrate with the passivation layer; and treating the transparent conductive material layer, the metal layer and the anti-oxidation material layer through a single patterning process to form the contact layer, the pixel electrode, a gate metal pattern, an electrode metal pattern and an anti-oxidation layer.

Optionally, the step of forming the active layer, the common electrode and the source/drain metal pattern on the base substrate through a single patterning process includes: forming an IGZO layer on the base substrate; treating the IGZO layer to form a conductive IGZO layer; forming a metal layer on the base substrate with the conductive IGZO layer; forming a photoresist layer on the base substrate with the metal layer; exposing and developing the base substrate with the photoresist layer through a multi-tone mask plate to form a first photoresist pattern which includes a first photoresist region corresponding to a region where the source/drain metal pattern is to be formed, a second photoresist region corresponding to a region where the common electrode is to be formed, a third photoresist region corresponding to a region where the active layer is to be formed, and a first photoresist-unreserved region corresponding to the other region, a thickness of a photoresist at the first photoresist region, the second photoresist region, the third photoresist region and the first photoresist-unreserved region being reduced gradually; removing the conductive IGZO layer and the metal layer corresponding to the first photoresist-unreserved region through an etching process to form the initial active layer made of the conductive IGZO layer and the common electrode made of the conductive IGZO layer; removing the photoresist at the third photoresist region through an ashing process; removing the metal layer corresponding to the third photoresist region through an etching process to form the source/drain metal pattern; treating the initial active layer made of the conductive IGZO layer to form the active layer made of the semiconductive IGZO layer; removing the photoresist at the second photoresist region through an ashing process; removing the metal layer corresponding to the second photoresist layer through an etching process; and removing the photoresist at the first photoresist region through a stripping process.

Optionally, the step of treating the transparent conductive material layer, the metal layer and the anti-oxidation material layer through a single patterning process to form the contact layer, the pixel electrode, the gate metal pattern, the electrode metal pattern and the anti-oxidation layer includes: forming a photoresist layer on the base substrate with the anti-oxidation material layer; exposing and developing the base substrate with the photoresist layer through a multi-tone mask plate to form a second photoresist pattern which includes a fourth photoresist region corresponding a region where the gate metal pattern, the electrode metal pattern, the contact layer and the anti-oxidation layer are to be formed, a fifth photoresist region corresponding to a region where the pixel electrode is to be formed, and a second photoresist-unreserved region corresponding to the other region, a thickness of a photoresist at the fourth photoresist region, the fifth photoresist region and the second photoresist-unreserved region being reduced gradually; removing the transparent conductive material layer, the metal layer and the anti-oxidation material layer corresponding to the second photoresist-unreserved region through an etching process; removing the photoresist at the fifth photoresist region through an ashing process; removing the metal layer and the anti-oxidation material layer corresponding to the fifth photoresist region through an etching process; and removing the photoresist at the fourth photoresist region through a stripping process.

Optionally, the step of treating the IGZO layer to form the conductive IGZO layer includes subjecting the IGZO layer to hydrogenation and deoxidation. The step of treating the initial active layer made of the conductive IGZO layer to form the active layer made of the semiconductive IGZO layer includes subjecting the initial active layer made of the conductive IGZO layer to oxygenation.

Optionally, the transparent conductive material is indium tin oxide (ITO) or indium zinc oxide (IZO).

In another aspect, the present disclosure provides in some embodiments an array substrate, including: a base substrate; a passivation layer on the base substrate; and a contact layer and a pixel electrode formed on the base substrate with the passivation layer; the contact layer being made of a transparent conductive material identical to the pixel electrode.

Optionally, an active layer, a common electrode and a source/drain metal pattern are formed on the base substrate, the active layer is located at a layer identical to the common electrode, and the passivation layer is formed on the base substrate with the active layer, the common electrode and the source/drain metal pattern.

Optionally, the active layer is made of semiconductive IGZO, the common electrode is made of conductive IGZO, and the active layer is located at a layer identical to the common electrode.

Optionally, a contact layer, a pixel electrode, a gate metal pattern, an electrode metal pattern and an anti-oxidation layer are formed on the base substrate with the passivation layer, the gate metal pattern and the electrode metal pattern are arranged on the contact layer, and the anti-oxidation layer is arranged on the gate metal pattern and the electrode metal pattern.

Optionally, the transparent conductive material is ITO or IZO.

In yet another aspect, the present disclosure provides in some embodiments a display device including the above-mentioned array substrate.

According to the array substrate, its manufacturing method and the display device in the embodiments of the present disclosure, the pixel electrode and the contact layer are formed by the same transparent conductive material. The transparent conductive material has a strong adhesive force relative to the metal layer, the passivation layer and the base substrate. During the manufacture, it is merely required to form the transparent conductive material layer on the passivation layer to form the contact layer and the pixel electrode through a single patterning process, without any necessary to form a material layer with a strong adhesive force relative to $SiO_2$ and copper and a metal layer on the passivation layer and the base substrate sequentially. As a result, it is able to simplify the manufacture of the array substrate.

It should be appreciated that, the above-mentioned general description and the following details are for illustrative and explanatory purposes only, but shall not be used to limit the scope of the present disclosure.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

FIG. 2-1 is another flow chart of the method for manufacturing the array substrate according to one embodiment of the present disclosure;

FIG. 2-2 is a topical, schematic view showing the array substrate according to one embodiment of the present disclosure;

FIG. 2-21 is a schematic view showing the formation of the array substrate according to one embodiment of the present disclosure;

FIG. 2-22 is another schematic view showing the formation of the array substrate according to one embodiment of the present disclosure;

FIG. 2-23 is yet another schematic view showing the formation of the array substrate according to one embodiment of the present disclosure;

FIG. 2-24 is still yet another schematic view showing the formation of the array substrate according to one embodiment of the present disclosure;

FIG. 2-25 is still yet another schematic view showing the formation of the array substrate according to one embodiment of the present disclosure;

FIG. 2-26 is still yet another schematic view showing the formation of the array substrate according to one embodiment of the present disclosure;

FIG. 2-27 is still yet another schematic view showing the formation of the array substrate according to one embodiment of the present disclosure;

FIG. 2-28 is still yet another schematic view showing the formation of the array substrate according to one embodiment of the present disclosure;

FIG. 2-29 is still yet another schematic view showing the formation of the array substrate according to one embodiment of the present disclosure;

FIG. 2-3 is yet another topical, schematic view showing the array substrate according to one embodiment of the present disclosure;

FIG. 2-4 is still yet another topical, schematic view showing the array substrate according to one embodiment of the present disclosure;

FIG. 2-5 is still yet another topical, schematic view showing the array substrate according to one embodiment of the present disclosure;

FIG. 2-51 is a schematic view showing the formation of the array substrate according to one embodiment of the present disclosure;

FIG. 2-52 is another schematic view showing the formation of the array substrate according to one embodiment of the present disclosure;

FIG. 2-53 is yet another schematic view showing the formation of the array substrate according to one embodiment of the present disclosure;

FIG. 2-54 is still yet another schematic view showing the formation of the array substrate according to one embodiment of the present disclosure;

FIG. 2-55 is still yet another schematic view showing the formation of the array substrate according to one embodiment of the present disclosure;

FIG. 3 is a schematic view showing the array substrate according to one embodiment of the present disclosure; and FIG. 4 is another schematic view showing the array substrate according to one embodiment of the present disclosure.

Figure 1:
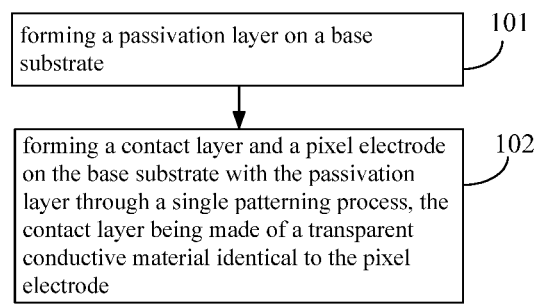
FIG. 1 is a flow chart of a method for manufacturing an array substrate according to one embodiment of the present disclosure.

The above drawings show the embodiments of the present disclosure, which will be described in more details hereinafter. The drawings and the description thereof shall not be used to limit the scope of the present disclosure in any way, but are used to illustrate the concepts of the present disclosure with reference to the specific embodiments.

DETAILED DESCRIPTION

In order to make the objects, the technical solutions and the advantages of the present disclosure more apparent, the present disclosure will be described hereinafter in a clear and complete manner in conjunction with the drawings and embodiments.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

A TFT structure may include an active layer, a source/drain metal pattern, a pixel electrode, a passivation layer, a gate metal pattern and an electrode metal pattern. The gate metal pattern and the pixel electrode are formed on the passivation layer, and the electrode metal pattern is formed on a base substrate. The gate metal pattern and the electrode metal pattern are both made of copper, and the passivation layer and the base substrate are both made of $SiO_2$. There is a relatively weak adhesive force between copper and $SiO_2$. In the related art, in order to effectively adhere the gate metal pattern onto the passivation layer and effectively adhere the electrode metal pattern onto the base substrate, a material layer having a relatively strong adhesive force relative to $SiO_2$ and copper and a metal layer may be formed sequentially on the passivation layer and the base substrate, and the gate metal pattern, the electrode metal pattern, and a contact layer between the passivation layer and the gate metal pattern and between the base substrate and the electrode metal layer may be formed through a single patterning process. The contact layer is made of a material having a relatively strong adhesive force relative to $SiO_2$ and copper. Through the contact layer between the passivation layer and the gate metal pattern and between the base substrate and the electrode metal pattern, the gate metal pattern may be effectively adhered onto the passivation layer, and the electrode metal pattern may be effectively adhered onto the base substrate.

During the manufacture of the array substrate, it is required to form the material layer with a relatively strong adhesive force relative to $SiO_2$ and copper, and the metal layer on the passivation layer and the base substrate sequentially to form the contact layer between the gate metal patterns and between the electrode metal pattern and the base substrate. Hence, the manufacture of the array substrate is relatively complex.

As shown in FIG. 1, the present disclosure provides in some embodiments a method for manufacturing an array substrate, which may include Step 101 of forming a passivation layer on a base substrate, and Step 102 of forming a contact layer and a pixel electrode on the base substrate with the passivation layer through a single patterning process. The contact layer is made of a transparent conductive material identical to the pixel electrode.

According to the method in the embodiments of the present disclosure, the pixel electrode and the contact layer are formed by the same transparent conductive material. The transparent conductive material has a strong adhesive force relative to the metal layer, the passivation layer and the base substrate. During the manufacture, it is merely required to form the transparent conductive material layer on the passivation layer, so as to form the contact layer and the pixel electrode through a single patterning process, without any necessary to form a material layer with a strong adhesive force relative to $SiO_2$ and copper and a metal layer on the passivation layer and the base substrate sequentially. As a result, it is able to simplify the manufacture of the array substrate.

Optionally, prior to Step 101, the method may further include forming an active layer, a common electrode and a source/drain metal pattern on the base substrate through a single patterning process. Step 101 may include forming the passivation layer on the base substrate with the active layer, the common electrode and the source/drain metal pattern.

The step of forming the active layer, the common electrode and the source/drain metal pattern on the base substrate through a single patterning process may include: forming an IGZO layer on the base substrate; treating the IGZO layer to form a conductive IGZO layer; forming a metal layer on the base substrate with the conductive IGZO layer; treating the IGZO layer and the metal layer through a single patterning process to form the source/drain metal pattern, an initial active layer made of the conductive IGZO layer, and the common electrode made of the conductive IGZO layer; and treating the initial active layer made of the conductive IGZO Layer to form an active layer made of a semiconductive IGZO layer.

Optionally, Step 102 may include: forming a transparent conductive material layer, a metal layer and an anti-oxidation material layer sequentially on the base substrate with the passivation layer; and treating the transparent conductive material layer, the metal layer and the anti-oxidation material layer through a single patterning process to form the contact layer, the pixel electrode, a gate metal pattern, an electrode metal pattern and an anti-oxidation layer.

For example, the step of forming the active layer, the common electrode and the source/drain metal pattern on the base substrate through a single patterning process may include: forming an IGZO layer on the base substrate; treating the IGZO layer to form a conductive IGZO layer; forming a metal layer on the base substrate with the conductive IGZO layer; forming a photoresist layer on the base substrate with the metal layer; exposing and developing the base substrate with the photoresist layer through a multi-tone mask plate to form a first photoresist pattern which includes a first photoresist region corresponding to a region where the source/drain metal pattern is to be formed, a second photoresist region corresponding to a region where the common electrode is to be formed, a third photoresist region corresponding to a region where the active layer is to be formed, and a first photoresist-unreserved region corresponding to the other region, a thickness of a photoresist at the first photoresist region, the second photoresist region, the third photoresist region and the first photoresist-unreserved region being reduced gradually; removing the conductive IGZO layer and the metal layer corresponding to the first photoresist-unreserved region through an etching process to form the initial active layer made of the conductive IGZO layer and the common electrode made of the conductive IGZO layer; removing the photoresist at the third photoresist region through an ashing process; removing the metal layer corresponding to the third photoresist region through an etching process to form the source/drain metal pattern; treating the initial active layer made of the conductive IGZO layer to form the active layer made of the semiconductive IGZO layer; removing the photoresist at the second photoresist region through an ashing process; removing the metal layer corresponding to the second photoresist layer through an etching process; and removing the photoresist at the first photoresist region through a stripping process.

For example, the step of treating the transparent conductive material layer, the metal layer and the anti-oxidation material layer through a single patterning process to form the contact layer, the pixel electrode, the gate metal pattern, the electrode metal pattern and the anti-oxidation layer may include: forming a photoresist layer on the base substrate with the anti-oxidation material layer; exposing and developing the base substrate with the photoresist layer through a multi-tone mask plate to form a second photoresist pattern which includes a fourth photoresist region corresponding a region where the gate metal pattern, the electrode metal pattern, the contact layer and the anti-oxidation layer are to be formed, a fifth photoresist region corresponding to a region where the pixel electrode is to be formed, and a second photoresist-unreserved region corresponding to the other region, a thickness of a photoresist at the fourth photoresist region, the fifth photoresist region and the second photoresist-unreserved region being reduced gradually; removing the transparent conductive material layer, the metal layer and the anti-oxidation material layer corresponding to the second photoresist-unreserved region through an etching process; removing the photoresist at the fifth photoresist region through an ashing process; removing the metal layer and the anti-oxidation material layer corresponding to the fifth photoresist region through an etching process; and removing the photoresist at the fourth photoresist region through a stripping process.

Optionally, the step of treating the IGZO layer to form the conductive IGZO layer includes subjecting the IGZO layer to hydrogenation and deoxidation. The step of treating the initial active layer made of the conductive IGZO layer to form the active layer made of the semiconductive IGZO layer includes subjecting the initial active layer made of the conductive IGZO layer to oxygenation.

For example, the transparent conductive material is ITO or IZO.

According to the method in the embodiments of the present disclosure, the pixel electrode and the contact layer are formed by the same transparent conductive material. The transparent conductive material has a strong adhesive force relative to the metal layer, the passivation layer and the base substrate. During the manufacture, it is merely required to form the transparent conductive material layer on the passivation layer, so as to form the contact layer and the pixel electrode through a single patterning process, without any necessary to form a material layer with a strong adhesive force relative to $SiO_2$ and copper and a metal layer on the passivation layer and the base substrate sequentially. As a result, it is able to simplify the manufacture of the array substrate.

Figures 1, 2:
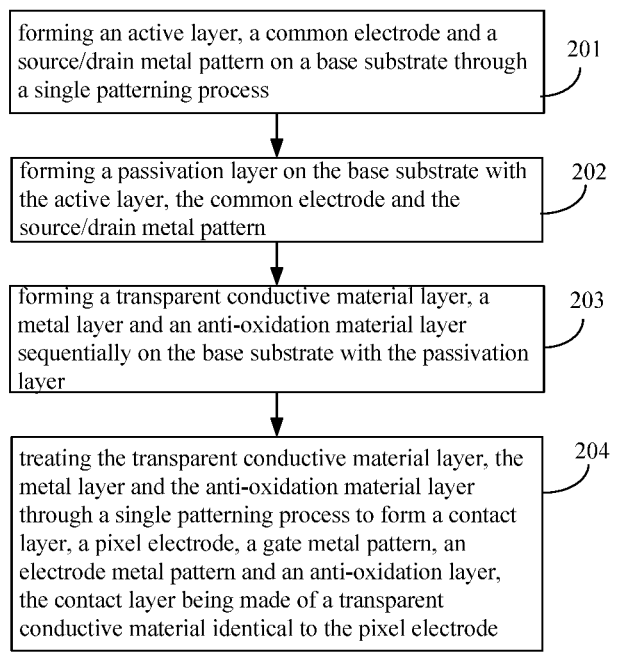
Figure 2:
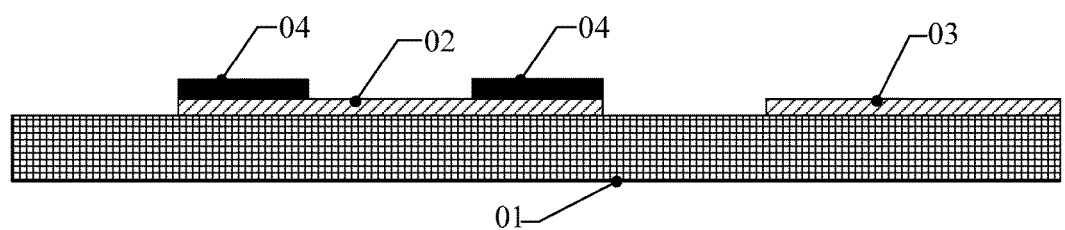

As shown in FIG. 2-1, the present disclosure provides in some embodiments a method for manufacturing an array substrate, which may include the following steps.

Step 201: forming an active layer, a common electrode and a source/drain metal pattern on a base substrate through a single patterning process.

As shown in FIG. 2-2, the active layer 02 made of semiconductive IGZO, the common electrode 03 made of conductive IGZO and the source/drain metal pattern 04 may be formed on the base substrate 01 through a single patterning process. The active layer is made of semiconductive IGZO and the common electrode is made of conductive IGZO, and IGZO has relatively large mobility. Hence, the array substrate including the active layer and the common electrode has an excellent TFT characteristic.

To be specific, the single patterning process may include a photoresist coating process, an exposing process, an etching process, an ashing process and a stripping process. The step of forming the active layer, the common electrode and the source/drain metal pattern on the base substrate may include the following steps.

As shown in FIG. 2-21, an IGZO layer X may be formed on the base substrate, and then treated to form a conductive IGZO layer. For example, the IGZO layer may be formed through coating, magnetron sputtering, thermal evaporation or chemical vapor deposition (CVD). During the actual application, the IGZO layer may also be formed through any other methods, which will not be particularly defined herein. Optionally, the step of treating the IGZO layer to form the conductive IGZO layer includes subjecting the IGZO layer to hydrogenation and deoxidation. To be specific, hydrogen ions may be doped into the IGZO layer to increase the number of free electrons in the IGZO layer, thereby to increase the conductivity of the IGZO layer and form the conductive IGZO layer.

As shown in FIG. 2-22, a metal layer Y may be formed on the base substrate with the conductive IGZO layer X. Optionally, the metal layer may be made of copper. It should be appreciated that, the metal layer may also be made of any other metals, which will not be particularly defined herein.

As shown in FIG. 2-23, a photoresist layer M may be formed on the base substrate with the metal layer Y. For example, the photoresist layer M may be coated onto the base substrate with the metal layer Y.

As shown in FIG. 2-24, the base substrate with the photoresist layer may be exposed and developed through a multi-tone mask plate to form a first photoresist pattern Z. The first photoresist pattern Z may include a first photoresist region Z1 corresponding to a region where the source/drain metal pattern is to be formed, a second photoresist region Z2 corresponding to a region where the common electrode is to be formed, a third photoresist region Z3 corresponding to a region where the active layer is to be formed, and a first photoresist-unreserved region Z4 corresponding to the other region, and a thickness of a photoresist at the first photoresist region Z1, the second photoresist region Z2, the third photoresist region Z3 and the first photoresist-unreserved region Z4 is reduced gradually. To be specific, the multi-tone mask plate may be provided with a plurality of regions with different light transmittance. The base substrate with the photoresist layer M may be covered by the multi-tone mask plate, and then the base substrate and the multi-tone mask plate may be exposed to light. Due to light beams transmitted through different regions on the multi-tone mask plate, it is able to expose the photoresist layer M to different extents, thereby to provide the photoresist layer M with different thicknesses. In this way, it is able to form the first photoresist pattern Z including the first photoresist region Z1, the second photoresist region Z2, the third photoresist region Z3 and the first photoresist-unreserved region Z4.

As shown in FIG. 2-25, the conductive IGZO layer X and the metal layer Y corresponding to the first photoresist-unreserved region Z4 may be removed through an etching process to form an initial active layer made of the conductive IGZO layer and the common electrode 03 made of the conductive IGZO layer.

As shown in FIG. 2-26, the photoresist at the third photoresist region Z3 may be removed through an ashing process. It should be appreciated that, because the photoresist at the first photoresist region Z1 and the second photoresist region Z2 has a thickness greater than that at the third photoresist region Z3, the photoresist at the first photoresist region Z1 and the second photoresist region Z2 may not be totally removed in the case of removing the photoresist at the third photoresist region Z3. At this time, the thickness of the photoresist at the first photoresist region Z1 and the second photoresist region Z2 may be reduced correspondingly.

As shown in FIG. 2-27, the metal layer Y corresponding to the third photoresist region Z3 may be removed through an etching process to form the source/drain metal pattern 04.

Then, the initial active layer made of the conductive IGZO layer may be treated to form the active layer made of the semiconductive IGZO layer. It should be appreciated that, because the source/drain metal pattern and the common electrode are both covered with the photoresist, they may not become semiconductive in the case of treating the initial active layer made of the conductive IGZO layer. Optionally, the step of treating the initial active layer made of the conductive IGZO layer to form the active layer made of the semiconductive IGZO layer includes subjecting the initial active layer made of the conductive IGZO layer to oxygenation. To be specific, oxygen ions may be doped into the initial active layer made of the conductive IGZO layer to reduce the number of free electrons in the initial active layer, thereby to reduce the conductivity of the initial active layer. In addition, the oxygenation may also include treatment with nitrogen monoxide and oxidization annealing, which will not be particularly defined herein.

As shown in FIG. 2-28, the photoresist at the second photoresist region Z2 may be removed through an ashing process. It should be appreciated that, because the photoresist at the second photoresist region Z2 has a thickness smaller than that at the first photoresist region Z1, the photoresist at the first photoresist region Z1 may not be removed in the case of removing the photoresist at the second photoresist region Z2. At this time, the thickness of the photoresist at the first photoresist region Z1 may be reduced correspondingly.

As shown in FIG. 2-29, the metal layer Y corresponding to the second photoresist region Z2 may be removed through an etching process.

Finally, the photoresist at the first photoresist region Z1 may be removed through a stripping process to obtain the structure as shown in FIG. 2-2.

On one hand, silicon is used in the related art to form the active layer. Because there is a relatively weak adhesive force between silicon and a metal, it is impossible for the source/drain metal pattern to be effectively adhered onto the active layer. To solve this problem, usually a contact layer having a relatively strong adhesive force to silicon and the metal is formed between the active layer and the source/drain metal pattern. However, in the embodiments of the present disclosure, the semiconductive oxide has a relatively strong adhesive force to both the base substrate and the source/drain metal pattern, so it is unnecessary to form the contact layer between the active layer and the source/drain metal pattern. As a result, it is able to simplify the manufacture of the array substrate. On the other hand, the active layer is made of a material different the common electrode in the related art, so the active layer and the common electrode need to be formed on the base substrate through two patterning processes. However, in the embodiments of the present disclosure, the active layer and the common electrode are both made of the semiconductor oxide, so it is merely required to form them on the base substrate through a single patterning process. As a result, it is also able to simplify the manufacture of the array substrate.

Step 202: forming a passivation layer on the base substrate with the active layer, the common electrode and the source/drain metal pattern.

Figures 2, 3, 4, 5, 6, 7, 8, 9, 10, 11, 12, 13, 14, 15, 16, 17, 18, 19, 20, 21:
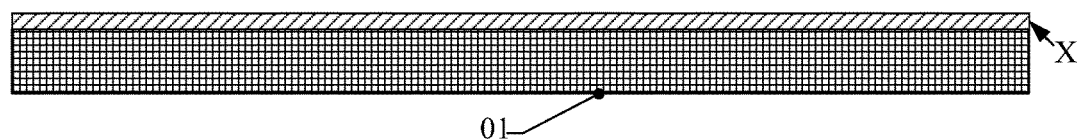
Figures 2, 3, 4, 5, 6, 7, 8, 9, 10, 11, 12, 13, 14, 15, 16, 17, 18, 19, 20, 21, 22:
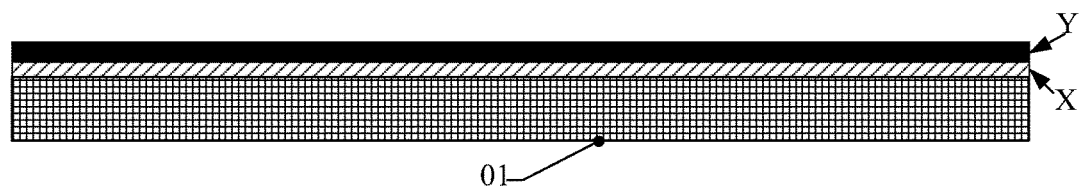
Figures 2, 3, 4, 5, 6, 7, 8, 9, 10, 11, 12, 13, 14, 15, 16, 17, 18, 19, 20, 21, 22, 23:
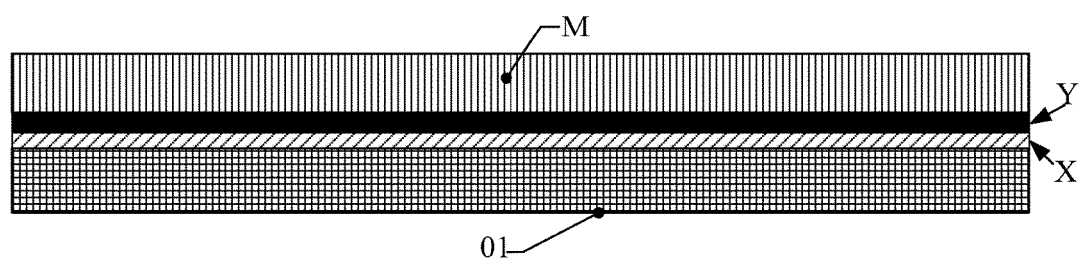
Figures 2, 3, 4, 5, 6, 7, 8, 9, 10, 11, 12, 13, 14, 15, 16, 17, 18, 19, 20, 21, 22, 23, 24:
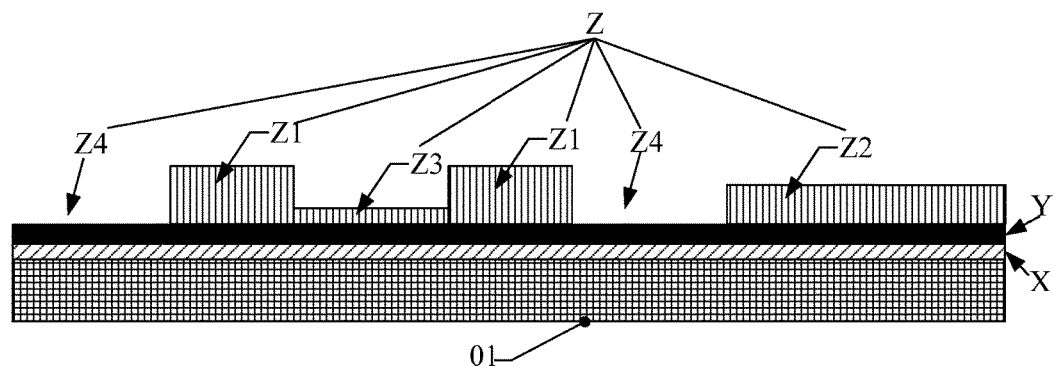
Figures 2, 3, 4, 5, 6, 7, 8, 9, 10, 11, 12, 13, 14, 15, 16, 17, 18, 19, 20, 21, 22, 23, 24, 25:
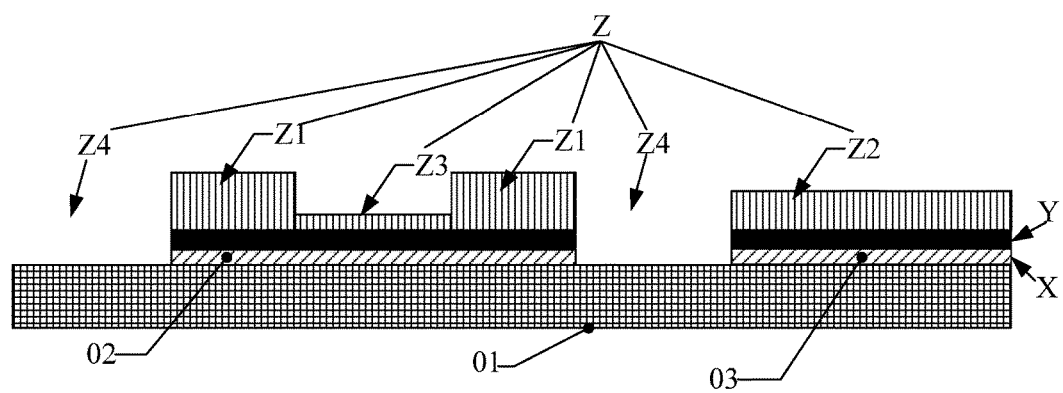
Figures 2, 3, 4, 5, 6, 7, 8, 9, 10, 11, 12, 13, 14, 15, 16, 17, 18, 19, 20, 21, 22, 23, 24, 25, 26:
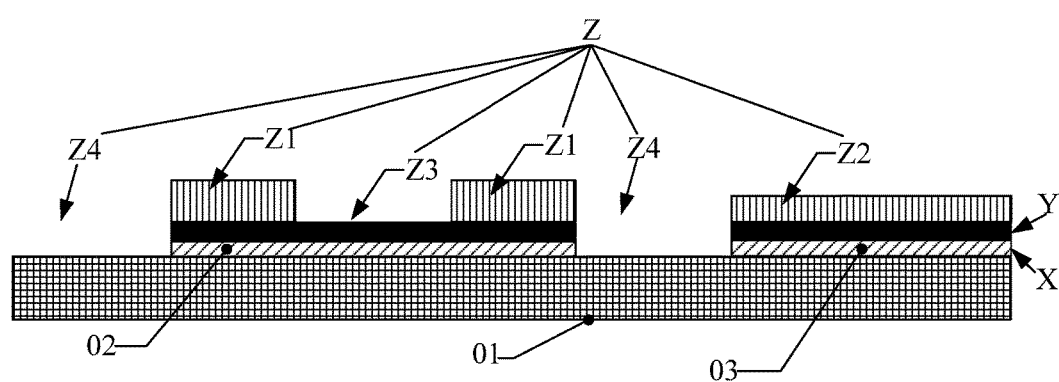
Figures 2, 3, 4, 5, 6, 7, 8, 9, 10, 11, 12, 13, 14, 15, 16, 17, 18, 19, 20, 21, 22, 23, 24, 25, 26, 27:
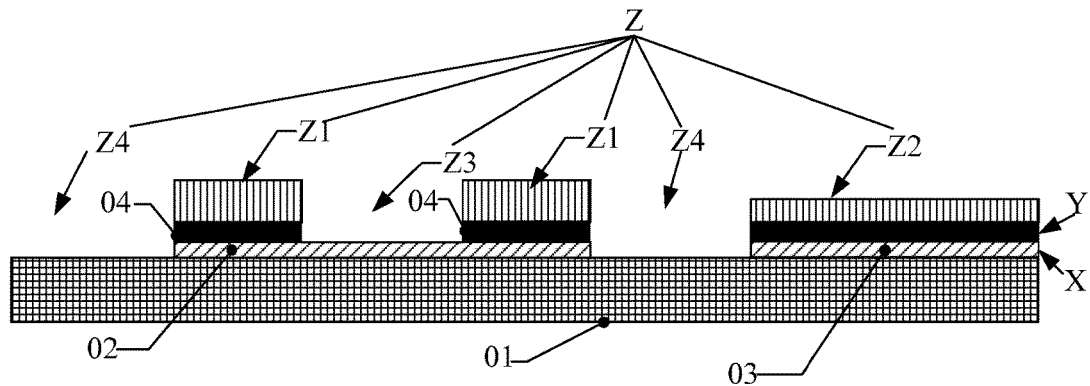
Figures 2, 3, 4, 5, 6, 7, 8, 9, 10, 11, 12, 13, 14, 15, 16, 17, 18, 19, 20, 21, 22, 23, 24, 25, 26, 27, 28:
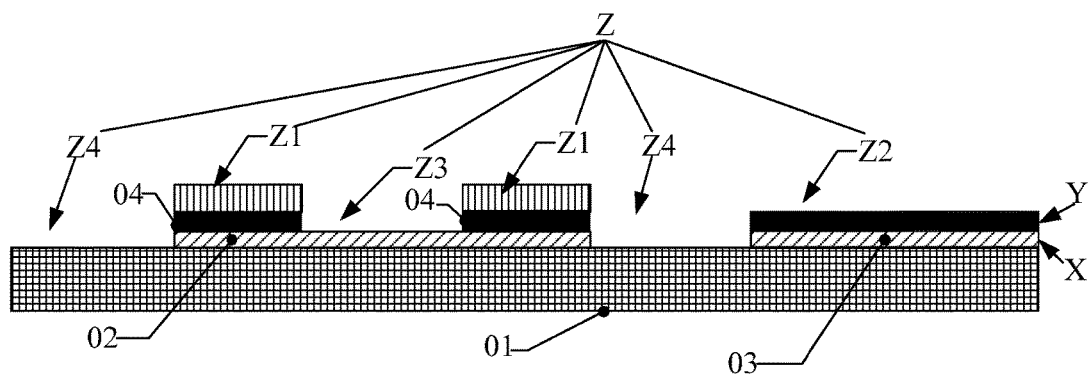
Figures 2, 3, 4, 5, 6, 7, 8, 9, 10, 11, 12, 13, 14, 15, 16, 17, 18, 19, 20, 21, 22, 23, 24, 25, 26, 27, 28, 29:
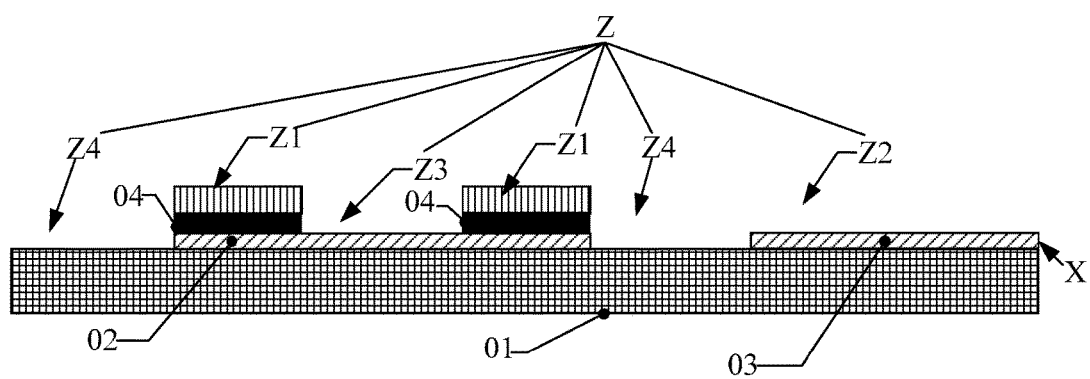
Figures 2, 3:
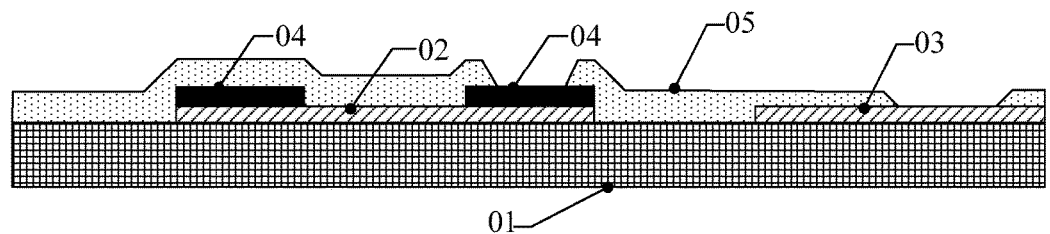
Figures 2, 3, 4:
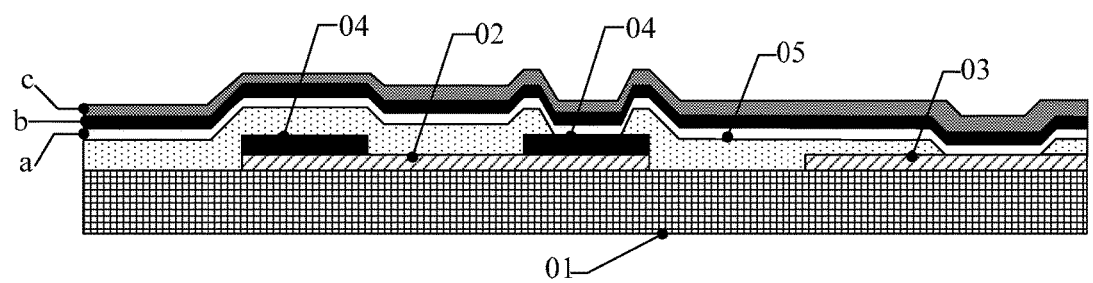
Figures 2, 3, 4, 5:
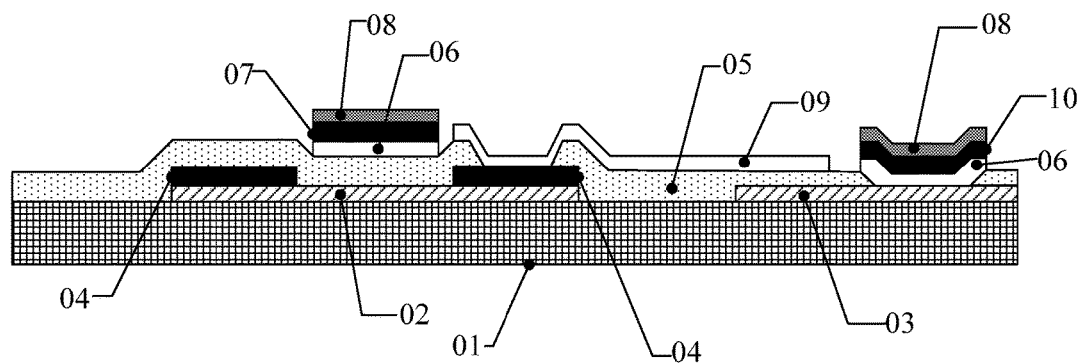
Figures 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51:
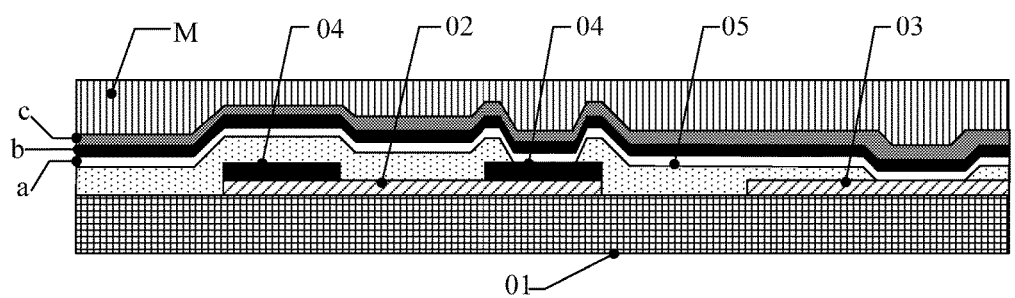
Figures 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52:
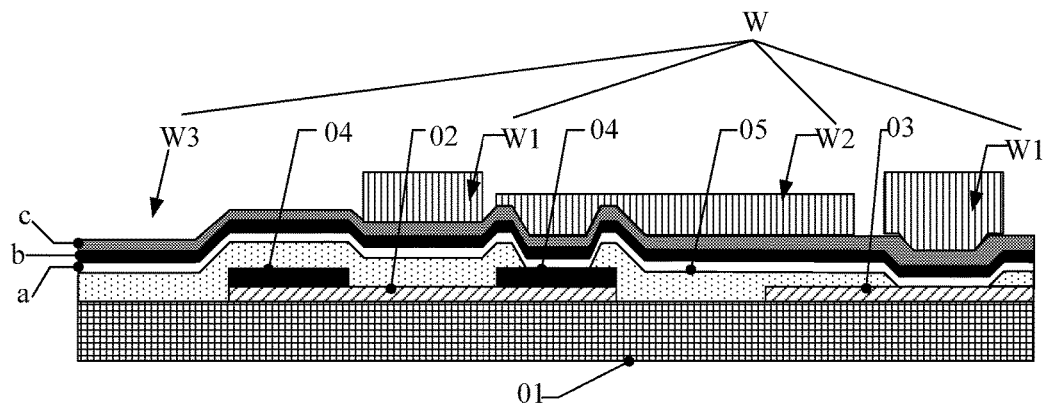

As shown in FIG. 2-3, subsequent to the formation of the active layer 02 made of the semiconductive IGZO layer, the common electrode 03 made of the conductive IGZO layer and the source/drain metal pattern 04 on the base substrate 01, the passivation layer 05 may be formed on the base substrate 01 with the active layer 02, the common electrode 03 and the source/drain metal pattern 04.

Step 203: forming a transparent conductive material layer, a metal layer and an anti-oxidation material layer sequentially on the base substrate with the passivation layer.

Optionally, as shown in FIG. 2-4, the transparent conductive material layer a, the metal layer b and the anti-oxidation material layer c may be formed sequentially on the base substrate 01 with the passivation layer 05. The transparent conductive material layer may be made of ITO or IZO, the metal layer may be made of copper, and the anti-oxidation material layer may be mad of ITO or a molybdenum (Mo)-niobium (Nb) alloy. The transparent conductive material layer a, the metal layer b and the anti-oxidation material layer c may be formed through coating, magnetron sputtering, thermal evaporation or CVD. During the actual application, the transparent conductive material layer a, the metal layer b and the anti-oxidation material layer c may also be formed through any other methods, which will not be particularly defined herein.

Step 204: treating the transparent conductive material layer, the metal layer and the anti-oxidation material layer through a single patterning process to form a contact layer, a pixel electrode, a gate metal pattern, an electrode metal pattern and an anti-oxidation layer. The contact layer is made of a transparent conductive material identical to the pixel electrode.

For example, as shown in FIG. 2-5, the transparent conductive material layer a, the metal layer b and the anti-oxidation material layer c may be treated through a single patterning process to form the contact layer 06, the pixel electrode 09, the gate metal pattern 07, the electrode metal pattern 10 and the anti-oxidation layer 08 on the base substrate 01. Because merely a single patterning process is used, it is able to simplify the manufacture of the array substrate.

To be specific, the single patterning process may include a photoresist coating process, an exposing process, an etching process, an ashing process and a stripping process. The step of treating the transparent conductive material layer a, the metal layer b and the anti-oxidation material layer c through a single patterning process to form the contact layer, the pixel electrode, the gate metal pattern, the electrode metal pattern and the anti-oxidation layer may include the following steps.

As shown in FIG. 2-51, a photoresist layer M may be formed on the base substrate with the anti-oxidation material layer c. For example, the photoresist layer M may be coated onto the base substrate with the anti-oxidation material layer c.

As shown in FIG. 2-52, the base substrate with the photoresist layer M may be exposed and developed through a multi-tone mask plate to form a second photoresist pattern W which includes a fourth photoresist region W1 corresponding a region where the gate metal pattern 07, the electrode metal pattern 10, the contact layer 06 and the anti-oxidation layer 08 are to be formed, a fifth photoresist region W2 corresponding to a region where the pixel electrode 09 is to be formed, and a second photoresist-unreserved region W3 corresponding to the other region. A thickness of a photoresist at the fourth photoresist region W1, the fifth photoresist region W2 and the second photoresist-unreserved region W3 may be reduced gradually.

Figures 2, 53:
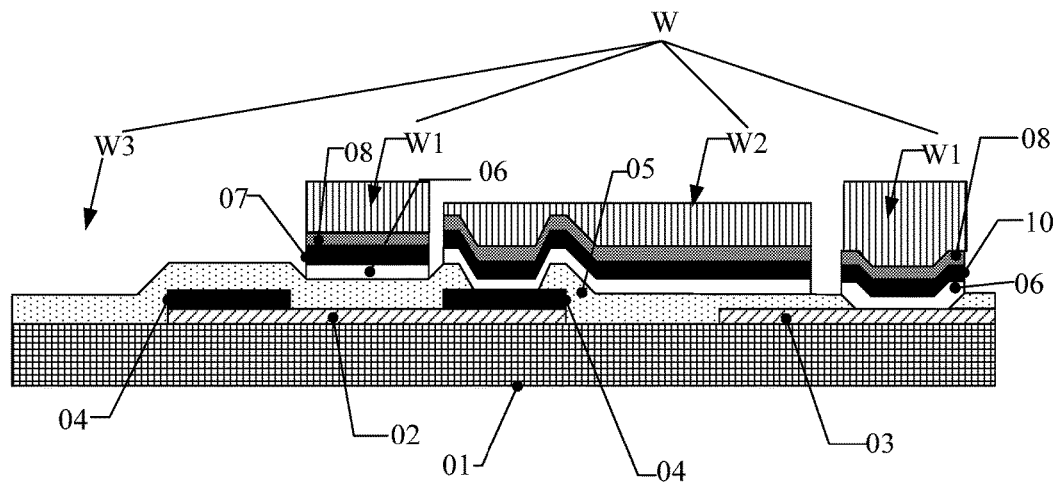

As shown in FIG. 2-53, the transparent conductive material layer, the metal layer and the anti-oxidation material layer corresponding to the second photoresist-unreserved region W3 may be removed through an etching process to form a gate region, a pixel region and an electrode region. The contact layer 06 made of the transparent conductive material, the gate metal pattern 07 made of metal, the anti-oxidation layer 08 made of an anti-oxidation material, and the photoresist at the fourth photoresist region W1 corresponding to the region where the gate metal pattern 07 is located are sequentially formed at the gate region from the bottom up. The pixel electrode 09, the metal layer corresponding to the fifth photoresist region W2, the anti-oxidation material layer corresponding to the fifth photoresist region W2 and the photoresist at the fifth photoresist region W2 are sequentially formed at the pixel region from the bottom up. The contact layer 06 made of the transparent conductive material, the electrode metal pattern 10 made of metal, the anti-oxidation layer 08 made of the anti-oxidation material and the photoresist at the fourth photoresist region W3 corresponding to the region where the electrode metal pattern 10 is located are sequentially formed on the electrode region from the bottom up.

Figures 2, 54:
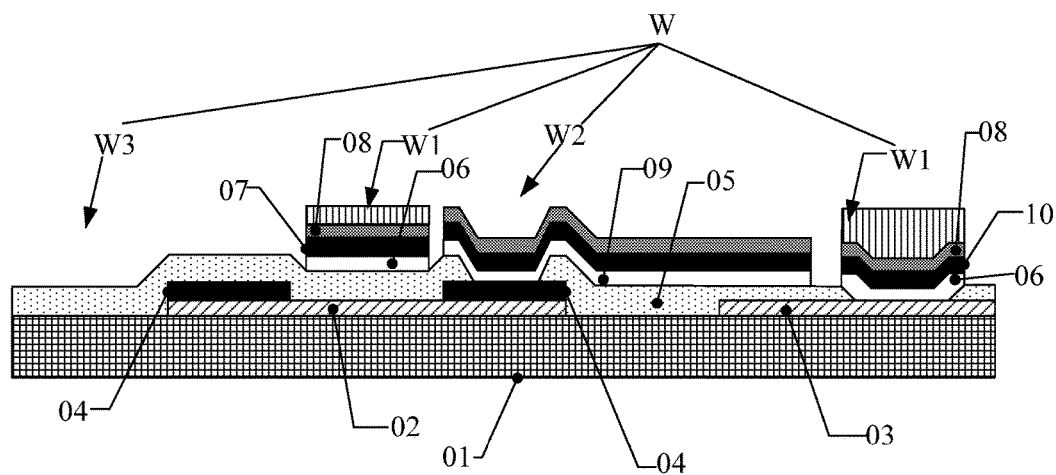

As shown in FIG. 2-54, the photoresist at the fifth photoresist region W2 may be removed through an ashing process. It should be appreciated that, the thickness of the photoresist at the fifth photoresist region W2 is smaller than that at the fourth photoresist region W 1, the photoresist at the fourth photoresist region W1 may not be removed in the case of removing the photoresist at the fifth photoresist region W2.

Figures 2, 55:
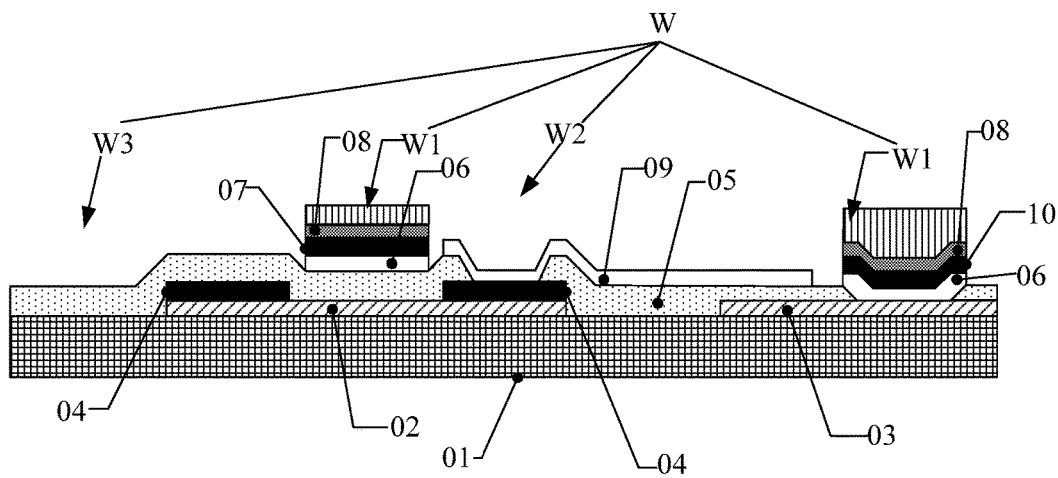
Figure 3:
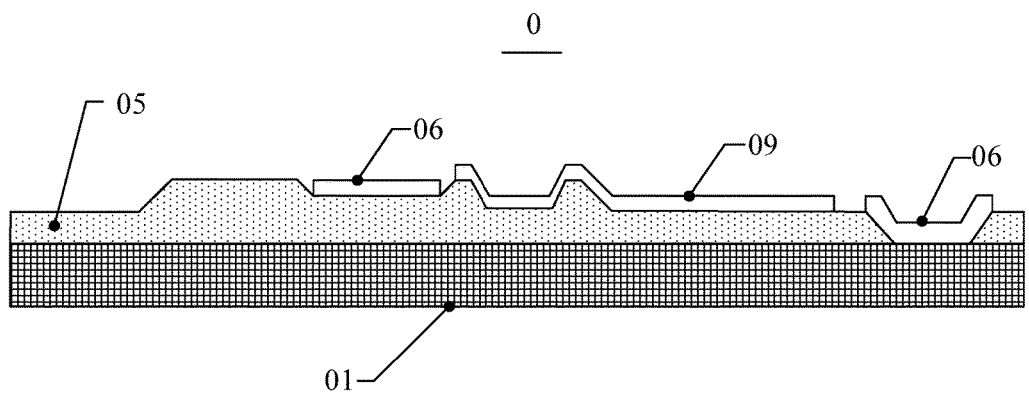
Figure 4:
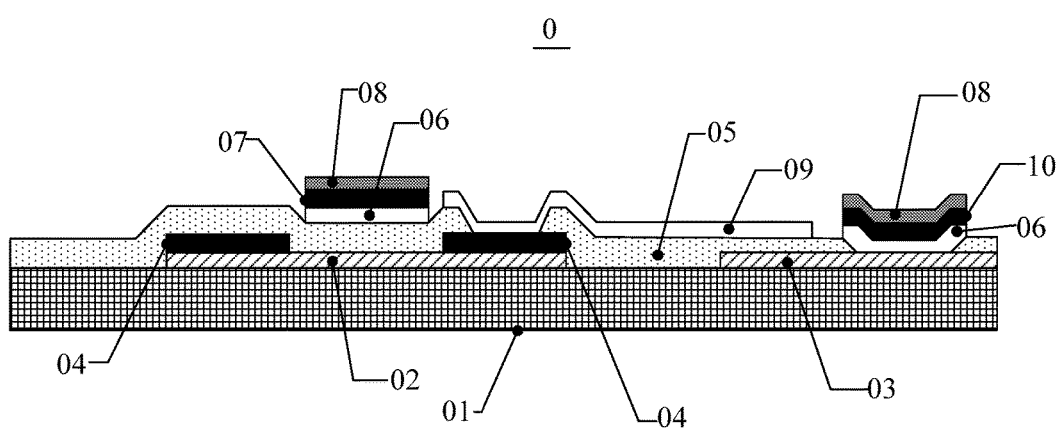

As shown in FIG. 2-55, the metal layer and the anti-oxidation material layer corresponding to the fifth photoresist region W2 may be removed through an etching process.

Finally, the photoresist at the fourth photoresist region W1 may be removed through a stripping process to obtain the structure as shown in FIG. 2-5.

The transparent conductive material has a strong adhesive force relative to the metal layer, the passivation layer and the base substrate and therefore can function as a contact layer. During the manufacture, it is merely required to form the transparent conductive material layer on the passivation layer to form the contact layer and the pixel electrode through a single patterning process, without any necessary to form a material layer with a strong adhesive force relative to SiO2 and copper and a metal layer on the passivation layer and the base substrate sequentially. As a result, it is able to simplify the manufacture of the array substrate. In addition, the gate metal pattern and the electrode metal pattern are both made of metal which may easily be oxidized. Through the anti-oxidation layer formed on the gate metal pattern and the electrode metal pattern, it is able to prevent the gate metal pattern and the electrode metal pattern from being oxidized.

According to the method in the embodiments of the present disclosure, the pixel electrode and the contact layer are formed by the same transparent conductive material. The transparent conductive material has a strong adhesive force relative to the metal layer, the passivation layer and the base substrate and therefore can function as a contact layer. During the manufacture, it is merely required to form the transparent conductive material layer on the passivation layer to form the contact layer and the pixel electrode through a single patterning process, without any necessary to form a material layer with a strong adhesive force relative to SiO2 and copper and a metal layer on the passivation layer and the base substrate sequentially. As a result, it is able to simplify the manufacture of the array substrate.

As shown in FIG. 3, the present disclosure provides in some embodiments an array substrate 0, which may include a base substrate 01, a passivation layer 05 formed on the base substrate 01, and a contact layer 06 and a pixel electrode 09 formed on the base substrate 01 with the passivation layer 05. The contact layer 06 is made of a transparent conductive material identical to the pixel electrode 09.

According to the array substrate in the embodiments of the present disclosure, the pixel electrode and the contact layer are formed by the same transparent conductive material. The transparent conductive material has a strong adhesive force relative to the metal layer, the passivation layer and the base substrate and therefore can function as a contact layer. During the manufacture, it is merely required to form the transparent conductive material layer on the passivation layer to form the contact layer and the pixel electrode through a single patterning process, without any necessary to form a material layer with a strong adhesive force relative to $SiO_2$ and copper and a metal layer on the passivation layer and the base substrate sequentially. As a result, it is able to simplify the manufacture of the array substrate.

As shown in FIG. 4, an active layer 02, a common electrode 03 and a source/drain metal pattern 04 may be formed on the base substrate 01, and the passivation layer 05 may be formed on the base substrate 01 with the active layer 02, the common electrode 03 and the source/drain metal pattern 04.

The active layer 02 may be made of semiconductor IGZO, the common electrode 03 may be made of conductive IGZO, and they may be arranged at an identical layer. IGZO has relatively large mobility, so the array substrate including the active layer 02 and the common electrode 03 has an excellent TFT characteristic.

As shown in FIG. 2-2, the active layer 02 made of semiconductive IGZO, the common electrode 03 made of conductive IGZO and the source/drain metal pattern 04 may be formed on the base substrate 01 through a single patterning process. To be specific, the single patterning process may include a photoresist coating process, an exposing process, an etching process, an ashing process and a stripping process. The active layer, the common electrode and the source/drain metal pattern may be formed on the base substrate as follows.

As shown in FIG. 2-21, an IGZO layer X may be formed on the base substrate, and then treated to form a conductive IGZO layer. For example, the IGZO layer may be formed through coating, magnetron sputtering, thermal evaporation or chemical vapor deposition (CVD). During the actual application, the IGZO layer may also be formed through any other methods, which will not be particularly defined herein. Optionally, the step of treating the IGZO layer to form the conductive IGZO layer includes subjecting the IGZO layer to hydrogenation and deoxidation. To be specific, hydrogen ions may be doped into the IGZO layer to increase the number of free electrons in the IGZO layer, thereby to increase the conductivity of the IGZO layer and form the conductive IGZO layer.

As shown in FIG. 2-22, a metal layer Y may be formed on the base substrate with the conductive IGZO layer X. Optionally, the metal layer may be made of copper. It should be appreciated that, the metal layer may also be made of any other metals, which will not be particularly defined herein.

As shown in FIG. 2-23, a photoresist layer M may be formed on the base substrate with the metal layer Y. For example, the photoresist layer M may be coated onto the base substrate with the metal layer Y.

As shown in FIG. 2-24, the base substrate with the photoresist layer may be exposed and developed through a multi-tone mask plate to form a first photoresist pattern Z. The first photoresist pattern Z may include a first photoresist region Z1 corresponding to a region where the source/drain metal pattern is to be formed, a second photoresist region Z2 corresponding to a region where the common electrode is to be formed, a third photoresist region Z3 corresponding to a region where the active layer is to be formed, and a first photoresist-unreserved region Z4 corresponding to the other region, and a thickness of a photoresist at the first photoresist region Z1, the second photoresist region Z2, the third photoresist region Z3 and the first photoresist-unreserved region Z4 is reduced gradually. To be specific, the multi-tone mask plate may be provided with a plurality of regions with different light transmittance. The base substrate with the photoresist layer M may be covered by the multi-tone mask plate, and then the base substrate and the multi-tone mask plate may be exposed to light. Due to light beams transmitted through different regions on the multi-tone mask plate, it is able to expose the photoresist layer M to different extents, thereby to provide the photoresist layer M with different thicknesses. In this way, it is able to form the first photoresist pattern Z including the first photoresist region Z1, the second photoresist region Z2, the third photoresist region Z3 and the first photoresist-unreserved region Z4.

As shown in FIG. 2-25, the conductive IGZO layer X and the metal layer Y corresponding to the first photoresist-unreserved region Z4 may be removed through an etching process to form an initial active layer made of the conductive IGZO layer and the common electrode 03 made of the conductive IGZO layer.

As shown in FIG. 2-26, the photoresist at the third photoresist region Z3 may be removed through an ashing process. It should be appreciated that, because the photoresist at the first photoresist region Z1 and the second photoresist region Z2 has a thickness greater than that at the third photoresist region Z3, the photoresist at the first photoresist region Z1 and the second photoresist region Z2 may not be removed in the case of removing the photoresist at the third photoresist region Z3. At this time, the thickness of the photoresist at the first photoresist region Z1 and the second photoresist region Z2 may be reduced correspondingly.

As shown in FIG. 2-27, the metal layer Y corresponding to the third photoresist region Z3 may be removed through an etching process to form the source/drain metal pattern 04.

Then, the initial active layer made of the conductive IGZO layer may be treated to form the active layer made of the semiconductive IGZO layer. It should be appreciated that, because the source/drain metal pattern and the common electrode are both covered with the photoresist, they may not become semiconductive in the case of treating the initial active layer made of the conductive IGZO layer. Optionally, the step of treating the initial active layer made of the conductive IGZO layer to form the active layer made of the semiconductive IGZO layer includes subjecting the initial active layer made of the conductive IGZO layer to oxygenation. To be specific, oxygen ions may be doped into the initial active layer made of the conductive IGZO layer to reduce the number of free electrons in the initial active layer, thereby to reduce the conductivity of the initial active layer. In addition, the oxygenation may also include treatment with nitrogen monoxide and oxidization annealing, which will not be particularly defined herein.

As shown in FIG. 2-28, the photoresist at the second photoresist region Z2 may be removed through an ashing process. It should be appreciated that, because the photoresist at the second photoresist region Z2 has a thickness smaller than that at the first photoresist region Z1, the photoresist at the first photoresist region Z1 may not be removed in the case of removing the photoresist at the second photoresist region Z2. At this time, the thickness of the photoresist at the first photoresist region Z1 may be reduced correspondingly.

As shown in FIG. 2-29, the metal layer Y corresponding to the second photoresist region Z2 may be removed through an etching process.

Finally, the photoresist at the first photoresist region Z1 may be removed through a stripping process to obtain the structure as shown in FIG. 2-2.

As shown in FIG. 2-3, subsequent to the formation of the active layer 02 made of the semiconductive IGZO layer, the common electrode 03 made of the conductive IGZO layer and the source/drain metal pattern 04 on the base substrate 01, the passivation layer 05 may be formed on the base substrate 01 with the active layer 02, the common electrode 03 and the source/drain metal pattern 04.

On one hand, silicon is used in the related art to form the active layer. Because there is a relatively weak adhesive force between silicon and a metal, it is impossible for the source/drain metal pattern to be effectively adhered onto the active layer. To solve this problem, usually a contact layer having a relatively strong adhesive force to silicon and the metal is formed between the active layer and the source/drain metal pattern. However, in the embodiments of the present disclosure, the semiconductive oxide has a relatively strong adhesive force to both the base substrate 01 and the source/drain metal pattern 04, so it is unnecessary to form the contact layer between the active layer 02 and the source/drain metal pattern 04. As a result, it is able to simplify the manufacture of the array substrate. On the other hand, the active layer is made of a material different the common electrode in the related art, so the active layer and the common electrode need to be formed on the base substrate through two patterning processes. However, in the embodiments of the present disclosure, the active layer 02 and the common electrode 03 are both made of the semiconductor oxide, so it is merely required to form them on the base substrate 01 through a single patterning process. As a result, it is also able to simplify the manufacture of the array substrate.

A contact layer 06, a pixel electrode 09, a gate metal pattern 07, an electrode metal pattern 10 and an anti-oxidation layer 08 are formed on the substrate 01 with the passivation layer 05. The gate metal pattern 07 and the electrode metal pattern 10 are arranged on the contact layer 06, and the anti-oxidation layer 08 is arranged on the gate metal pattern 07 and the electrode metal pattern 10.

Optionally, as shown in FIG. 2-4, the transparent conductive material layer a, the metal layer b and the anti-oxidation material layer c may be formed sequentially on the base substrate 01 with the passivation layer 05. The transparent conductive material layer may be made of ITO or IZO, the metal layer may be made of copper, and the anti-oxidation material layer may be mad of ITO or a Mo—Nb alloy. The transparent conductive material layer a, the metal layer b and the anti-oxidation material layer c may be formed through coating, magnetron sputtering, thermal evaporation or CVD. During the actual application, the transparent conductive material layer a, the metal layer b and the anti-oxidation material layer c may also be formed through any other methods, which will not be particularly defined herein.

For example, as shown in FIG. 2-5, the transparent conductive material layer a, the metal layer b and the anti-oxidation material layer c may be treated through a single patterning process to form the contact layer 06, the pixel electrode 09, the gate metal pattern 07, the electrode metal pattern 10 and the anti-oxidation layer 08 on the base substrate 01. Because merely a single patterning process is used, it is able to simplify the manufacture of the array substrate.

To be specific, the single patterning process may include a photoresist coating process, an exposing process, an etching process, an ashing process and a stripping process. The contact layer, the pixel electrode, the gate metal pattern, the electrode metal pattern and the anti-oxidation layer may be formed as follows.

As shown in FIG. 2-51, a photoresist layer M may be formed on the base substrate with the anti-oxidation material layer c. For example, the photoresist layer M may be coated onto the base substrate with the anti-oxidation material layer c.

As shown in FIG. 2-52, the base substrate with the photoresist layer M may be exposed and developed through a multi-tone mask plate to form a second photoresist pattern W which includes a fourth photoresist region W1 corresponding a region where the gate metal pattern 07, the electrode metal pattern 10, the contact layer 06 and the anti-oxidation layer 08 are to be formed, a fifth photoresist region W2 corresponding to a region where the pixel electrode 09 is to be formed, and a second photoresist-unreserved region W3 corresponding to the other region. A thickness of a photoresist at the fourth photoresist region, the fifth photoresist region and the second photoresist-unreserved region may be reduced gradually.

As shown in FIG. 2-53, the transparent conductive material layer, the metal layer and the anti-oxidation material layer corresponding to the second photoresist-unreserved region W3 may be removed through an etching process to form a gate region, a pixel region and an electrode region. The contact layer 06 made of the transparent conductive material, the gate metal pattern 07 made of metal, the anti-oxidation layer 08 made of an anti-oxidation material, and the photoresist at the fourth photoresist region W1 corresponding to the region where the gate metal pattern 07 is located are sequentially formed at the gate region from the bottom up. The pixel electrode 09, the metal layer corresponding to the fifth photoresist region W2, the anti-oxidation material layer corresponding to the fifth photoresist region W2 and the photoresist at the fifth photoresist region W2 are sequentially formed at the pixel region from the bottom up. The contact layer 06 made of the transparent conductive material, the electrode metal pattern 10 made of metal, the anti-oxidation layer 08 made of the anti-oxidation material and the photoresist at the fourth photoresist region W3 corresponding to the region where the electrode metal pattern 10 is located are sequentially formed on the electrode region from the bottom up.

As shown in FIG. 2-54, the photoresist at the fifth photoresist region W2 may be removed through an ashing process. It should be appreciated that, the thickness of the photoresist at the fifth photoresist region W2 is smaller than that at the fourth photoresist region W 1, the photoresist at the fourth photoresist region W1 may not be removed in the case of removing the photoresist at the fifth photoresist region W2.

As shown in FIG. 2-55, the metal layer and the anti-oxidation material layer corresponding to the fifth photoresist region W2 may be removed through an etching process.

Finally, the photoresist at the fourth photoresist region W1 may be removed through a stripping process to obtain the structure as shown in FIG. 2-5.

The transparent conductive material has a strong adhesive force relative to the metal layer, the passivation layer 05 and the base substrate 01. During the manufacture, it is merely required to form the transparent conductive material layer on the passivation layer 05, so as to form the contact layer 06 and the pixel electrode 09 through a single patterning process, without any necessary to form a material layer with a strong adhesive force relative to $SiO_2$ and copper and a metal layer on the passivation layer and the base substrate sequentially. As a result, it is able to simplify the manufacture of the array substrate. In addition, the gate metal pattern 07 and the electrode metal pattern 10 are both made of metal which may easily be oxidized. Through the anti-oxidation layer 08 formed on the gate metal pattern 07 and the electrode metal pattern 10, it is able to prevent the gate metal pattern 07 and the electrode metal pattern 10 from being oxidized.

According to the array substrate in the embodiments of the present disclosure, the pixel electrode and the contact layer are formed by the same transparent conductive material. The transparent conductive material has a strong adhesive force relative to the metal layer, the passivation layer and the base substrate. During the manufacture, it is merely required to form the transparent conductive material layer on the passivation layer, so as to form the contact layer and the pixel electrode through a single patterning process, without any necessary to form a material layer with a strong adhesive force relative to $SiO_2$ and copper and a metal layer on the passivation layer and the base substrate sequentially. As a result, it is able to simplify the manufacture of the array substrate.

The present disclosure further provides in some embodiments a display device which may include the array substrate 0 as shown in FIG. 3 or 4.

According to the display device in the embodiments of the present disclosure, the pixel electrode and the contact layer are formed by the same transparent conductive material. The transparent conductive material has a strong adhesive force relative to the metal layer, the passivation layer and the base substrate and therefore can function as a contact layer.

During the manufacture, it is merely required to form the transparent conductive material layer on the passivation layer, so as to form the contact layer and the pixel electrode through a single patterning process, without any necessary to form a material layer with a strong adhesive force relative to $SiO_2$ and copper and a metal layer on the passivation layer and the base substrate sequentially. As a result, it is able to simplify the manufacture of the array substrate.

All the above-mentioned technical solutions may be combined in any way to form the embodiments of the present disclosure, which will not be particularly defined herein.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A method for manufacturing an array substrate, comprising:
    forming a passivation layer on a base substrate; and
    forming a contact layer and a pixel electrode on the base substrate with the passivation layer through a single patterning process,
    wherein the contact layer is made of an identical transparent conductive material to the pixel electrode, the contact layer is arranged between the passivation layer and a gate metal pattern, or between the passivation layer and an electrode metal pattern, and the contact layer adheres the gate metal pattern or the electrode metal pattern to the passivation layer,
    wherein prior to forming the passivation layer on the base substrate, the method further comprises forming an active layer, a common electrode and a source/drain metal pattern on the base substrate through a single patterning process; and
        forming the passivation layer on the base substrate comprises forming the passivation layer on the base substrate with the active layer, the common electrode and the source/drain metal pattern,
    wherein the forming the active layer, the common electrode and the source/drain metal pattern on the base substrate through a single patterning process comprises:
        forming an indium gallium zinc oxide (IGZO) layer on the base substrate;
        treating the IGZO layer to form a conductive IGZO layer;
        forming a metal layer on the base substrate with the conductive IGZO layer;
        treating the conductive IGZO layer and the metal layer through a single patterning process, to form the source/drain metal pattern, an initial active layer made of the conductive IGZO layer, and the common electrode made of the conductive IGZO layer; and
        treating the initial active layer made of the conductive IGZO layer to form an active layer made of a semiconductive IGZO layer.

2. The method according to claim 1, wherein forming the contact layer and the pixel electrode on the base substrate with the passivation layer through a single patterning process comprises:
    forming a transparent conductive material layer, a metal layer and an anti-oxidation material layer sequentially on the base substrate with the passivation layer; and
    treating the transparent conductive material layer, the metal layer and the anti-oxidation material layer through a single patterning process to form the contact layer, the pixel electrode, the gate metal pattern, the electrode metal pattern and an anti-oxidation layer.

3. The method according to claim 2, wherein treating the transparent conductive material layer, the metal layer and the anti-oxidation material layer through a single patterning process to form the contact layer, the pixel electrode, the gate metal pattern, the electrode metal pattern and the anti-oxidation layer comprises:
    forming a photoresist layer on the base substrate with the anti-oxidation material layer;
    exposing and developing the base substrate with the photoresist layer through a multi-tone mask plate to form a second photoresist pattern which comprises a fourth photoresist region corresponding a region where the gate metal pattern, the electrode metal pattern, the contact layer and the anti-oxidation layer are to be formed, a fifth photoresist region corresponding to a region where the pixel electrode is to be formed, and a second photoresist-unreserved region corresponding to the other region, a thickness of a photoresist at the fourth photoresist region, the fifth photoresist region and the second photoresist-unreserved region being reduced gradually;
    removing the transparent conductive material layer, the metal layer and the anti-oxidation material layer corresponding to the second photoresist-unreserved region through an etching process;
    removing the photoresist at the fifth photoresist region through an ashing process;
    removing the metal layer and the anti-oxidation material layer corresponding to the fifth photoresist region through an etching process; and
    removing the photoresist at the fourth photoresist region through a stripping process.

4. The method according to claim 1, wherein treating the IGZO layer to form the conductive IGZO layer comprises subjecting the IGZO layer to hydrogenation and deoxidation; and
    treating the initial active layer made of the conductive IGZO layer to form the active layer made of the semiconductive IGZO layer comprises subjecting the initial active layer made of the conductive IGZO layer to oxygenation.

5. The method according to claim 1, wherein the transparent conductive material is indium tin oxide (ITO) or indium zinc oxide (IZO).

6. The method according to claim 1, wherein forming the contact layer and the pixel electrode on the base substrate with the passivation layer through a single patterning process comprises:
    forming a transparent conductive material layer, a metal layer and an anti-oxidation material layer sequentially on the base substrate with the passivation layer; and
    treating the transparent conductive material layer, the metal layer and the anti-oxidation material layer through a single patterning process to form the contact layer, the pixel electrode, the gate metal pattern, the electrode metal pattern and an anti-oxidation layer.

7. The method according to claim 6, wherein treating the transparent conductive material layer, the metal layer and the anti-oxidation material layer through a single patterning process to form the contact layer, the pixel electrode, the gate metal pattern, the electrode metal pattern and the anti-oxidation layer comprises:

forming a photoresist layer on the base substrate with the anti-oxidation material layer;

exposing and developing the base substrate with the photoresist layer through a multi-tone mask plate to form a second photoresist pattern which comprises a fourth photoresist region corresponding a region where the gate metal pattern, the electrode metal pattern, the contact layer and the anti-oxidation layer are to be formed, a fifth photoresist region corresponding to a region where the pixel electrode is to be formed, and a second photoresist-unreserved region corresponding to the other region, a thickness of a photoresist at the fourth photoresist region, the fifth photoresist region and the second photoresist-unreserved region being reduced gradually;

removing the transparent conductive material layer, the metal layer and the anti-oxidation material layer corresponding to the second photoresist-unreserved region through an etching process;

removing the photoresist at the fifth photoresist region through an ashing process;

removing the metal layer and the anti-oxidation material layer corresponding to the fifth photoresist region through an etching process; and removing the photoresist at the fourth photoresist region through a stripping process.

8. The method according to claim 1, wherein forming the contact layer and the pixel electrode on the base substrate with the passivation layer through a single patterning process comprises:

forming a transparent conductive material layer, a metal layer and an anti-oxidation material layer sequentially on the base substrate with the passivation layer; and treating the transparent conductive material layer, the metal layer and the anti-oxidation material layer through a single patterning process to form the contact layer, the pixel electrode, the gate metal pattern, the electrode metal pattern and an anti-oxidation layer.

9. The method according to claim 8, wherein treating the transparent conductive material layer, the metal layer and the anti-oxidation material layer through a single patterning process to form the contact layer, the pixel electrode, the gate metal pattern, the electrode metal pattern and the anti-oxidation layer comprises:

forming a photoresist layer on the base substrate with the anti-oxidation material layer;

exposing and developing the base substrate with the photoresist layer through a multi-tone mask plate to form a second photoresist pattern which comprises a fourth photoresist region corresponding a region where the gate metal pattern, the electrode metal pattern, the contact layer and the anti-oxidation layer are to be formed, a fifth photoresist region corresponding to a region where the pixel electrode is to be formed, and a second photoresist-unreserved region corresponding to the other region, a thickness of a photoresist at the fourth photoresist region, the fifth photoresist region and the second photoresist-unreserved region being reduced gradually;

removing the transparent conductive material layer, the metal layer and the anti-oxidation material layer corresponding to the second photoresist-unreserved region through an etching process;

removing the photoresist at the fifth photoresist region through an ashing process;

removing the metal layer and the anti-oxidation material layer corresponding to the fifth photoresist region through an etching process; and removing the photoresist at the fourth photoresist region through a stripping process.

10. The method according to claim 1, wherein treating the IGZO layer to form the conductive IGZO layer comprises subjecting the IGZO layer to hydrogenation and deoxidation; and treating the initial active layer made of the conductive IGZO layer to form the active layer made of the semiconductive IGZO layer comprises subjecting the initial active layer made of the conductive IGZO layer to oxygenation.

11. The method according to claim 1, wherein the passivation layer, the contact layer and the gate metal pattern are laminated, or the passivation layer, the contact layer and the electrode metal pattern are laminated.

12. A method for manufacturing an array substrate, comprising:

forming a passivation layer on a base substrate; and forming a contact layer and a pixel electrode on the base substrate with the passivation layer through a single patterning process, wherein the contact layer is made of an identical transparent conductive material to the pixel electrode, wherein prior to forming the passivation layer on the base substrate, the method further comprises forming an active layer, a common electrode and a source/drain metal pattern on the base substrate through a single patterning process; and forming the passivation layer on the base substrate comprises forming the passivation layer on the base substrate with the active layer, the common electrode and the source/drain metal pattern, and wherein forming the active layer, the common electrode and the source/drain metal pattern on the base substrate through a single patterning process comprises:

forming an indium gallium zinc oxide (IGZO) layer on the base substrate;

treating the IGZO layer to form a conductive IGZO layer;

forming a metal layer on the base substrate with the conductive IGZO layer;

treating the conductive IGZO layer and the metal layer through a single patterning process, to form the source/drain metal pattern, an initial active layer made of the conductive IGZO layer, and the common electrode made of the conductive IGZO layer; and treating the initial active layer made of the conductive IGZO layer to form an active layer made of a semiconductive IGZO layer.

13. The method according to claim 12, wherein forming the contact layer and the pixel electrode on the base substrate with the passivation layer through a single patterning process comprises:

forming a transparent conductive material layer, a metal layer and an anti-oxidation material layer sequentially on the base substrate with the passivation layer; and treating the transparent conductive material layer, the metal layer and the anti-oxidation material layer through a single patterning process to form the contact layer, the pixel electrode, a gate metal pattern, an electrode metal pattern and an anti-oxidation layer.

14. The method according to claim 12, wherein forming the contact layer and the pixel electrode on the base substrate with the passivation layer through a single patterning process comprises:

forming a transparent conductive material layer, a metal layer and an anti-oxidation material layer sequentially on the base substrate with the passivation layer; and treating the transparent conductive material layer, the metal layer and the anti-oxidation material layer through a single patterning process to form the contact layer, the pixel electrode, a gate metal pattern, an electrode metal pattern and an anti-oxidation layer.

15. The method according to claim 12, wherein the treating the IGZO layer to form the conductive IGZO layer comprises subjecting the IGZO layer to hydrogenation and deoxidation; and treating the initial active layer made of the conductive IGZO layer to form the active layer made of the semiconductive IGZO layer comprises subjecting the initial active layer made of the conductive IGZO layer to oxygenation.

16. A method for manufacturing an array substrate, comprising:

forming a passivation layer on a base substrate; and forming a contact layer and a pixel electrode on the base substrate with the passivation layer through a single patterning process, wherein the contact layer is made of an identical transparent conductive material to the pixel electrode, wherein prior to forming the passivation layer on the base substrate, the method further comprises forming an active layer, a common electrode and a source/drain metal pattern on the base substrate through a single patterning process; and forming the passivation layer on the base substrate comprises forming the passivation layer on the base substrate with the active layer, the common electrode and the source/drain metal pattern, and wherein forming the active layer, the common electrode and the source/drain metal pattern on the base substrate through a single patterning process comprises:

forming an indium gallium zinc oxide (IGZO) layer on the base substrate;

treating the IGZO layer to form a conductive IGZO layer;

forming a metal layer on the base substrate with the conductive IGZO layer;

forming a photoresist layer on the base substrate with the metal layer;

exposing and developing the base substrate with the photoresist layer through a multi-tone mask plate to form a first photoresist pattern which comprises a first photoresist region corresponding to a region where the source/drain metal pattern is to be formed, a second photoresist region corresponding to a region where the common electrode is to be formed, a third photoresist region corresponding to a region where the active layer is to be formed, and a first photoresist-unreserved region corresponding to the other region, a thickness of a photoresist at the first photoresist region, the second photoresist region, the third photoresist region and the first photoresist-unreserved region being reduced gradually;

removing the conductive IGZO layer and the metal layer corresponding to the first photoresist-unreserved region through an etching process to form the initial active layer made of the conductive IGZO layer and the common electrode made of the conductive IGZO layer;

removing the photoresist at the third photoresist region through an ashing process;

removing the metal layer corresponding to the third photoresist region through an etching process to form the source/drain metal pattern;

treating the initial active layer made of the conductive IGZO layer to form the active layer made of the semiconductive IGZO layer;

removing the photoresist at the second photoresist region through an ashing process;

removing the metal layer corresponding to the second photoresist layer through an etching process; and removing the photoresist at the first photoresist region through a stripping process.

17. The method according to claim 16, wherein forming the contact layer and the pixel electrode on the base substrate with the passivation layer through a single patterning process comprises:

forming a transparent conductive material layer, a metal layer and an anti-oxidation material layer sequentially on the base substrate with the passivation layer; and treating the transparent conductive material layer, the metal layer and the anti-oxidation material layer through a single patterning process to form the contact layer, the pixel electrode, a gate metal pattern, an electrode metal pattern and an anti-oxidation layer.

18. The method according to claim 16, wherein forming the contact layer and the pixel electrode on the base substrate with the passivation layer through a single patterning process comprises:

forming a transparent conductive material layer, a metal layer and an anti-oxidation material layer sequentially on the base substrate with the passivation layer; and treating the transparent conductive material layer, the metal layer and the anti-oxidation material layer through a single patterning process to form the contact layer, the pixel electrode, a gate metal pattern, an electrode metal pattern and an anti-oxidation layer.

* * * * *